United States Patent
Yoo et al.

(10) Patent No.: US 11,063,405 B2
(45) Date of Patent: Jul. 13, 2021

(54) OPTICAL SIGNAL TRANSMISSION APPARATUS INCLUDING TEMPERATURE-INDEPENDENT WAVELENGTH TUNABLE LASER, AND WAVELENGTH TUNING METHOD USING THE SAME

(71) Applicant: ELECTRONICS AND TELECOMMUNICATIONS RESEARCH INSTITUTE, Daejeon (KR)

(72) Inventors: Sanghwa Yoo, Daegu (KR); Kwangjoon Kim, Daejeon (KR); Joon Ki Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 465 days.

(21) Appl. No.: 16/028,723

(22) Filed: Jul. 6, 2018

(65) Prior Publication Data

US 2019/0115720 A1    Apr. 18, 2019

(30) Foreign Application Priority Data

Oct. 16, 2017 (KR) .................. 10-2017-0134267
Dec. 29, 2017 (KR) .................. 10-2017-0184528

(51) Int. Cl.
*H01S 5/068* (2006.01)
*H01S 5/125* (2006.01)
(Continued)

(52) U.S. Cl.
CPC .......... *H01S 5/068* (2013.01); *H01S 5/06256* (2013.01); *H01S 5/06804* (2013.01);
(Continued)

(58) Field of Classification Search
None
See application file for complete search history.

(56) References Cited

U.S. PATENT DOCUMENTS 6,271,960 B1 * 8/2001 Michishita ............ G02F 1/3523
                                                    359/326
2003/0147442 A1 * 8/2003 Larson ................ H01S 5/06256
                                                    372/50.11
(Continued)

FOREIGN PATENT DOCUMENTS

JP          2005-101039 A      4/2005

OTHER PUBLICATIONS

A. J. Ward et al., "Widely tunable DS-DBR laser with monolithically integrated SOA: design and performance", in IEEE Journal of Selected Topics in Quantum Electronics, vol. 11, No. 1, pp. 149-156. (Year: 2005).*

(Continued)

*Primary Examiner* — Eric L Bolda
(74) *Attorney, Agent, or Firm* — LRK Patent Law Firm

(57) ABSTRACT

An optical signal transmission apparatus including a temperature-independent wavelength tunable laser includes a distributed Bragg reflector (DBR) laser including a DBR mirror region configured to convert a wavelength of an output optical signal based on a first supply current, and an optical gain region configured to control a gain of the output optical signal based on a second supply current, a semiconductor optical amplifier (SOA) configured to amplify an optical signal output from the DBR laser based on a third supply current, and a processor configured to supply a compensation current to the optical gain region based on a wavelength conversion request, to suppress a wavelength overshoot due to a carrier effect caused by the first supply current provided to the DBR mirror region.

9 Claims, 6 Drawing Sheets

(51) Int. Cl.
*H04B 10/572* (2013.01)
*H01S 5/0625* (2006.01)
*H01S 5/50* (2006.01)
*H04B 10/50* (2013.01)
*H01S 5/06* (2006.01)
*H01S 5/026* (2006.01)

(52) U.S. Cl.
CPC ........... *H01S 5/125* (2013.01); *H04B 10/503* (2013.01); *H04B 10/572* (2013.01); *H01S 5/0265* (2013.01); *H01S 5/0617* (2013.01); *H01S 5/06253* (2013.01); *H01S 5/50* (2013.01)

(56) References Cited

U.S. PATENT DOCUMENTS

| | | | |
|---|---|---|---|
| 2003/0223470 A1* | 12/2003 | Ackerman | H01S 5/0021 372/29.02 |
| 2005/0225825 A1 | 10/2005 | Fraser et al. | |
| 2006/0039421 A1 | 2/2006 | Huang | |
| 2008/0175285 A1* | 7/2008 | Hu | H01S 5/06256 372/28 |
| 2008/0279234 A1* | 11/2008 | Gollier | H01S 5/0687 372/29.011 |
| 2009/0129414 A1* | 5/2009 | Gollier | H04N 9/3158 372/20 |
| 2011/0002349 A1 | 1/2011 | Mizutani et al. | |
| 2015/0349491 A1 | 12/2015 | Kwon et al. | |
| 2017/0264079 A1 | 9/2017 | Oh | |

OTHER PUBLICATIONS

Naoki Fujiwara et al., "Suppression of Thermal Wavelength Drift in Super-Structure Grating Distributed Bragg Reflector (SSG-DBR) Laser with Thermal Drift Compensator", IEEE Journal of Selected Topics in Quantum Electronics, vol. 13, No. 5, Sep./Oct. 2007.

\* cited by examiner

OPTICAL SIGNAL TRANSMISSION APPARATUS INCLUDING TEMPERATURE-INDEPENDENT WAVELENGTH TUNABLE LASER, AND WAVELENGTH TUNING METHOD USING THE SAME

CROSS-REFERENCE TO RELATED APPLICATION(S)

This application claims the priority benefit of Korean Patent Application No. 10-2017-0134267, filed on Oct. 16, 2017, and Korean Patent Application No. 10-2017-0184528, filed on Dec. 29, 2017, in the Korean Intellectual Property Office, the disclosures of which are incorporated herein by reference for all purposes.

BACKGROUND

1. Field of the Invention

One or more example embodiments relate to an optical signal transmission apparatus including a temperature-independent wavelength tunable laser, and a wavelength tuning method using the optical signal transmission apparatus. More particularly, one or more example embodiments relate to an optical signal transmission apparatus to suppress a wavelength drift phenomenon by compensating for a temperature of a distributed Bragg reflector (DBR) mirror increased due to a current supplied when a wavelength is changed.

2. Description of the Related Art

Recently, due to a sudden increase in traffic in data centers, power switch-based data center networking issues, such as a high power consumption, a network delay, limitations of networking scalability and increasing networking costs, continue to occur. To overcome the above issues, an optical switch-based data center networking with low power, low latency and scalability is being considered.

A wavelength tunable laser is a key device in an optical switching-based system. To minimize a loss of information when an optical switching is performed, a wavelength of a wavelength tunable laser needs to be converted at a high speed. Among various wavelength tunable lasers, a wavelength of a distributed Bragg reflector (DBR) laser may be controlled at a high speed using an opto-electronic conversion. However, a phenomenon in which a temperature is increased due to a current supplied to a DBR mirror region for wavelength tuning occurs. Due to the phenomenon, a wavelength drift phenomenon in which an oscillation wavelength of a wavelength tunable laser deviates from a target wavelength may occur.

SUMMARY

Example embodiments provide an apparatus and method for maintaining a constant temperature of an entire optical signal transmission apparatus by supplying compensation currents to an optical gain region and a semiconductor optical amplifier (SOA), in response to a temperature of a distributed Bragg reflector (DBR) wavelength tunable laser being increased due to a current supplied to a DBR mirror region of the DBR wavelength tunable laser.

According to an aspect, there is provided an optical signal transmission apparatus including a DBR laser that includes a DBR mirror region configured to convert a wavelength of an output optical signal based on a first supply current and an optical gain region configured to control a gain of the output optical signal based on a second supply current, an SOA configured to amplify an optical signal output from the DBR laser based on a third supply current, and a processor configured to supply a compensation current to the optical gain region based on a wavelength conversion request, to suppress a wavelength overshoot due to a carrier effect caused by the first supply current provided to the DBR mirror region.

The processor may be configured to supply a compensation current with an opposite sign to that of the first supply current to the optical gain region based on a wavelength switching time required by an application to which the DBR laser is applied.

The processor may be configured to adjust a magnitude of the compensation current to be in proportion to a magnitude of the first supply current.

According to another aspect, there is provided an optical signal transmission apparatus including a DBR laser that includes a DBR mirror region configured to convert a wavelength of an output optical signal based on a first supply current and an optical gain region configured to control a gain of the output optical signal based on a second supply current, an SOA configured to amplify an optical signal output from the DBR laser based on a third supply current, and a processor configured to supply a compensation current to the SOA based on a wavelength conversion request, to suppress a wavelength drift phenomenon due to a thermal effect caused by the first supply current provided to the DBR mirror region.

The processor may be configured to supply a compensation current with an opposite sign to that of the first supply current to the SOA based on a wavelength maintenance time required by an application to which the DBR laser is applied.

The processor may be configured to adjust a magnitude of the compensation current to be in proportion to a magnitude of the first supply current.

According to another aspect, there is provided an optical signal transmission apparatus including a DBR laser that includes a DBR mirror region configured to convert a wavelength of an output optical signal based on a first supply current and an optical gain region configured to control a gain of the output optical signal based on a second supply current, an SOA configured to amplify an optical signal output from the DBR laser based on a third supply current, and a processor configured to supply a first compensation current and a second compensation current to the optical gain region and the SOA, respectively, based on a wavelength conversion request, to suppress a wavelength overshoot due to a carrier effect caused by the first supply current provided to the DBR mirror region and a wavelength drift phenomenon due to a thermal effect caused by the first supply current.

The processor may be configured to supply a first compensation current with an opposite sign to that of the first supply current to the optical gain region based on a wavelength switching time required by an application to which the DBR laser is applied, and configured to supply a second compensation current with an opposite sign to that of the first supply current to the SOA based on a wavelength maintenance time required by the application to which the DBR laser is applied.

The processor may be configured to adjust a magnitude of each of the first compensation current and the second compensation current to be in proportion to a magnitude of the first supply current.

According to another aspect, there is provided a wavelength tuning method using an optical signal transmission apparatus including a temperature-independent DBR laser, the method including providing a first supply current to a DBR mirror region of the DBR laser to convert a wavelength of an output optical signal, and supplying a compensation current to an optical gain region of the DBR laser, to suppress a wavelength overshoot due to a carrier effect caused by the first supply current provided to the DBR mirror region.

The supplying of the compensation current may include supplying a compensation current with an opposite sign to that of the first supply current to the optical gain region based on a wavelength switching time required by an application to which the DBR laser is applied.

The supplying of the compensation current may include adjusting a magnitude of the compensation current to be in proportion to a magnitude of the first supply current.

According to another aspect, there is provided a wavelength tuning method using an optical signal transmission apparatus including a temperature-independent DBR laser, the method including providing a first supply current to a DBR mirror region of the DBR laser to convert a wavelength of an output optical signal, and supplying a compensation current to an SOA, to suppress a wavelength drift phenomenon due to a thermal effect caused by the first supply current provided to the DBR mirror region.

The supplying of the compensation current may include supplying a compensation current with an opposite sign to that of the first supply current to the SOA based on a wavelength maintenance time required by an application to which the DBR laser is applied.

The supplying of the compensation current may include adjusting a magnitude of the compensation current to be in proportion to a magnitude of the first supply current.

According to another aspect, there is provided a wavelength tuning method using an optical signal transmission apparatus including a temperature-independent DBR laser, the method including providing a first supply current to a DBR mirror region of the DBR laser to convert a wavelength of an output optical signal, and supplying a first compensation current and a second compensation current to an optical gain region of the DBR laser and an SOA, respectively, to suppress a wavelength overshoot due to a carrier effect caused by the first supply current provided to the DBR mirror region and a wavelength drift phenomenon due to a thermal effect caused by the first supply current.

The supplying of the first compensation current and the second compensation current may include supplying a first compensation current with an opposite sign to that of the first supply current to the optical gain region based on a wavelength switching time required by an application to which the DBR laser is applied, and supplying a second compensation current with an opposite sign to that of the first supply current to the SOA based on a wavelength maintenance time required by the application to which the DBR laser is applied.

The supplying of the first compensation current and the second compensation current may include adjusting a magnitude of each of the first compensation current and the second compensation current to be in proportion to a magnitude of the first supply current.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail with reference to the accompanying drawings.

Figure 1:
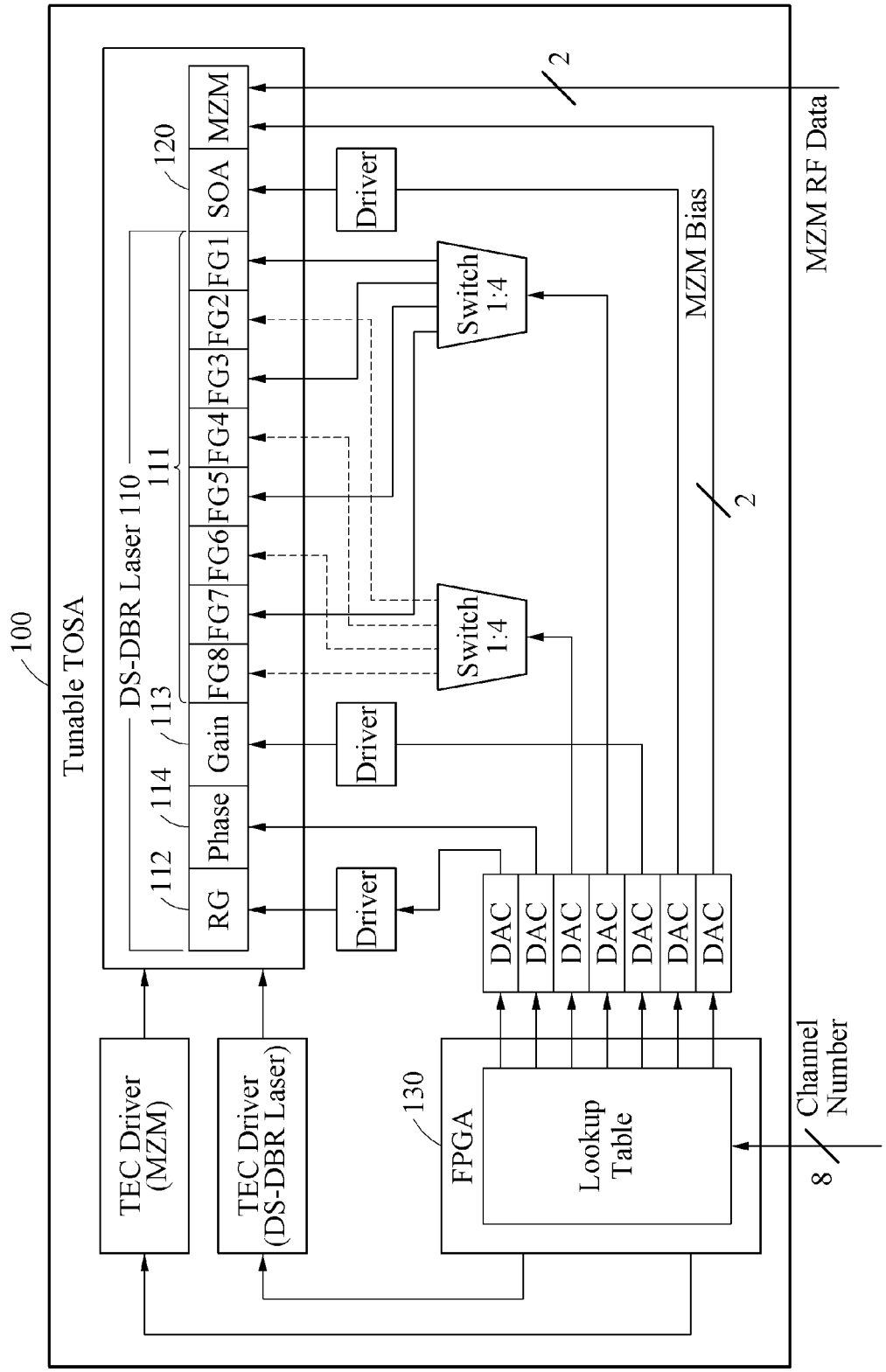
FIG. 1 is a diagram illustrating a configuration of an optical signal transmission apparatus including a distributed Bragg reflector (DBR) laser according to an example embodiment.

FIG. 1 is a diagram illustrating a configuration of an optical signal transmission apparatus including a distributed Bragg reflector (DBR) laser according to an example embodiment.

An optical signal transmission apparatus may include the DBR laser, a semiconductor optical amplifier (SOA) and a processor. The DBR laser may output an optical signal with a changed wavelength. The SOA may amplify an optical signal output through the DBR laser. The processor may control supply currents supplied to the DBR laser and the SOA.

The DBR laser may include two DBR mirrors. Types of the two DBR mirrors may be the same or different. In an example, when the DBR laser is a digital supermode (DS)-DBR laser, one of the DBR mirrors may have an attribute with a multi-reflection spectrum based on a wavelength, and the other DBR mirror may be in a form of a multi-contact chirped grating. In another example, when the DBR laser is a sampled grating (SG)-DBR laser, both the DBR mirrors may have attributes with a multi-reflection spectrum. However, a structure of the DBR laser according to an example embodiment is not limited thereto, and a form or an attribute of the DBR mirror may vary depending on a type of DBR lasers.

Referring to FIG. 1, an optical signal transmission apparatus 100 may include a DBR laser 110, a SOA 120 and a processor 130. The DBR laser 110 may output an optical signal with a changed wavelength. The SOA 120 may amplify an optical signal output through the DBR laser 110.

The processor 130 may control supply currents supplied to the DBR laser 110 and the SOA 120. The DBR laser 110 may include a front gating (FG) region 111 that is in the form of a multi-contact chirped grating, a rear grating (RG) region 112 having an attribute with a multi-reflection spectrum, an optical gain region 113 and a phase region 114. The processor 130 may include, for example, a field programmable gate array (FPGA).

In a lookup table of the processor 130, supply currents that need to be provided to each region of the DBR laser 110 and the SOA 120 may be set for each wavelength. A manual tuning region such as the FG region 111, the RG region 112 and the phase region 114 may be sensitive a change in current. In the manual tuning region, a high-performance digital-to-analog converter (DAC) such as a 16-bit DAC may be used to provide supply currents. Since an active tuning region such as the optical gain region 113 and the SOA 120 is less sensitive to a change in current, a low-performance DAC such as a 14-bit DAC may be used to provide supply currents. A supply current provided to the FG region 111 may need to be provided to a contact point of a neighboring FG region for a single wavelength operation, and accordingly a number of DACs required to operate eight FG regions 111 may be reduced to two by additionally using two 1×4 power switches.

The processor 130 may simultaneously provide analogy currents provided by a DAC to the RG region 112, the optical gain region 113 and the SOA 120 by controlling a current driver. A wavelength drift phenomenon suppression method of the optical signal transmission apparatus 100 may be applicable to a general DBR laser, for example, an SG-DBR laser, as well as a DS-DBR laser. Thus, the processor 130 may adjust supply currents provided to the optical gain region 113 and the SOA 120 based on supply currents provided to another region (for example, the FG region 111 or the phase region 114) during a conversion of an output wavelength of the DBR laser 110. Two thermo-electric cooler (TEC) drivers may maintain a temperature of an internal component and may provide a long-term wavelength stability.

A process of providing supply currents to each region of the optical signal transmission apparatus 100 is described below. The processor 130 may output a digital signal based on the lookup table. The lookup table may include information about supply currents that are supplied to each region of the optical signal transmission apparatus 100 and that are required by the DBR laser 110 to output an optical signal with various wavelengths. For example, in the lookup table, first supply currents provided to the RG region 112 for each output wavelength may be differently stored, and a second supply current provided to the optical gain region 113 and a third supply current provided to the SOA 120 may be stored as constant values regardless of a wavelength.

In other words, to output an optical signal of various wavelengths through the DBR laser 110, the optical signal transmission apparatus 100 may store different first supply currents provided to the RG region 112. This is because a wavelength drift phenomenon may dominantly occur due to a current of the RG region 112 that is typically considerably greater than currents of the FG region 111 and the phase region 114.

The output digital signal may be converted to an analog current in a DAC corresponding to each region of the DBR laser 110, and the analog current may be provided as a supply current to each region of the optical signal transmission apparatus 100 via each current driver DR.

Figure 2:
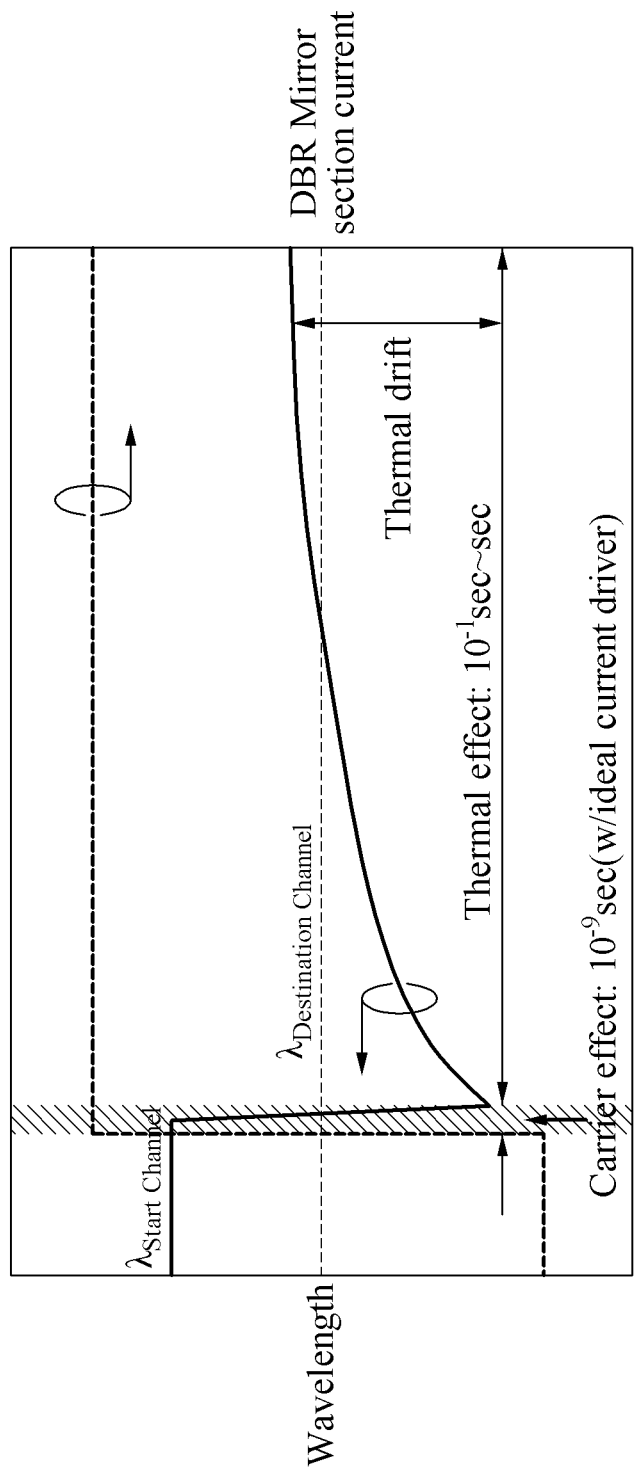
FIG. 2 illustrates a concept of a wavelength drift phenomenon for a DBR laser according to an example embodiment.

FIG. 2 illustrates a concept of a wavelength drift phenomenon for an optical signal transmission apparatus according to an example embodiment.

Referring to FIG. 2, a wavelength drift phenomenon may occur in the optical signal transmission apparatus 100 of FIG. 1. A current of tens of milliamperes (mA) may need to be provided to a DBR mirror region (corresponding to the RG region 112) of the DBR laser 110 of FIG. 1 so that the DBR laser 110 may output an optical signal with a wavelength converted in a wide wavelength band. For example, to change the wavelength of the output optical signal, the optical signal transmission apparatus 100 may provide a first supply current to the RG region 112 of the DBR laser 110 based on the lookup table of the processor 130. In this example, as shown in FIG. 2, an oscillation wavelength of an optical signal currently output by the DBR laser 110 is denoted by $\lambda_{Start\ Channel}$, and a target wavelength of an optical signal output by supplying a current of tens of mA is denoted by $\lambda_{Destination\ Channel}$.

When a first supply current of tens of mA is provided to the RG region 112 to convert an output wavelength of the output optical signal from the oscillation wavelength $\lambda_{Start\ Channel}$ to the target wavelength $\lambda_{Destination\ Channel}$, a wavelength of the optical signal output by the DBR laser 110 may have a shape as shown in FIG. 2. In other words, when the first supply current of tens of mA is provided to the RG region 112, a wavelength overshoot in which a wavelength of the output optical signal deviates from a target wavelength within a time interval in which a carrier effect occurs may occur.

Due to the first supply current provided to the RG region 112, a temperature of the DBR laser 110 may be increased, which may lead to a decrease in a refractive index of the DBR laser 110 to increase the wavelength of the output optical signal. A phenomenon in which an output wavelength of an optical signal output by the DBR laser 110 deviates from the target wavelength $\lambda_{Destination\ Channel}$ due to an increase in the temperature may be referred to as a "wavelength drift phenomenon due to a thermal effect". Since the wavelength drift phenomenon due to the thermal effect occurs in a time interval of at least hundreds of milliseconds (ms), it is impossible to transmit and/or exchange information in an optical switching-based system during the time interval.

Figure 3:
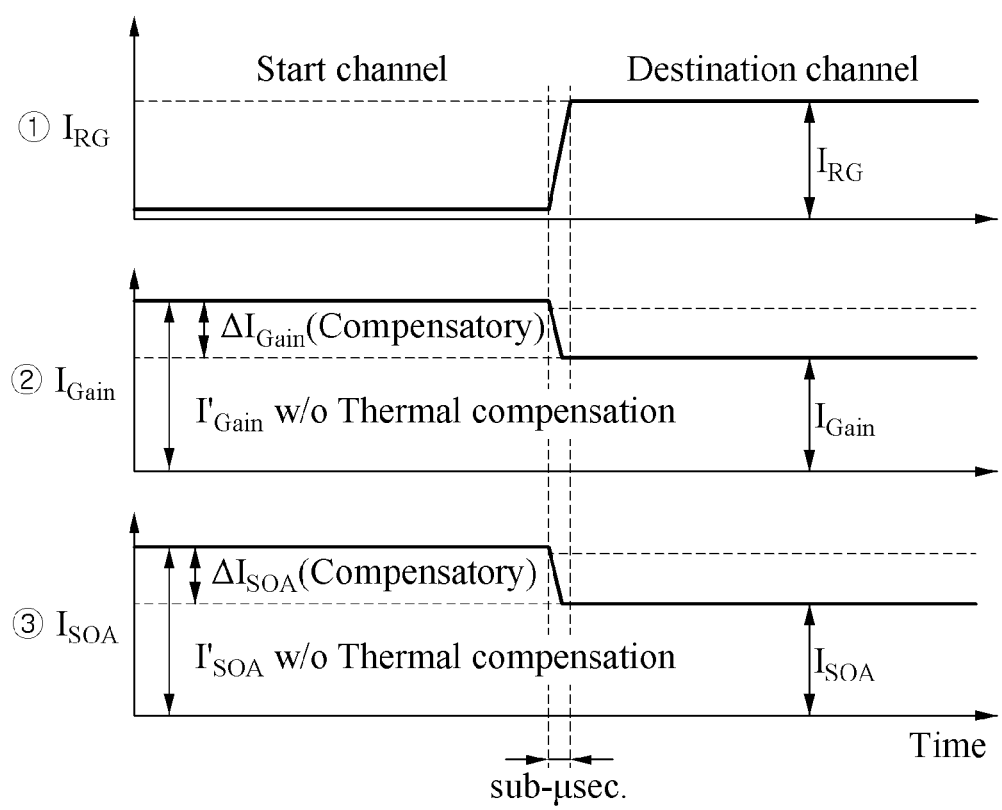
FIG. 3 illustrates a concept of suppressing a wavelength drift phenomenon due to a change in a temperature of a DBR laser according to an example embodiment.

FIG. 3 illustrates a concept of suppressing a wavelength drift phenomenon due to a change in a temperature of a DBR laser according to an example embodiment.

When a first supply current of tens of mA is provided to the RG region 112 of the DBR laser 110 to change a wavelength of an output optical signal, a wavelength overshoot due to a carrier effect and a wavelength drift phenomenon due to a thermal effect may occur. To suppress the wavelength drift phenomenon, example embodiments provide a method to maintain a constant temperature of the entire optical signal transmission apparatus 100 by supplying a first compensation current to the optical gain region 113 of the DBR laser 110 in response to a carrier effect of the DBR laser 110 or supplying a second compensation current to the SOA 120 in response to a thermal effect. The first compensation current supplied to the optical gain region 113 and the second compensation current supplied to the SOA 120 may be adjusted in proportion to a magnitude of the first supply current supplied to the RG region 112. The optical gain region 113 and the SOA 120 may differ from each other as described above, because the optical gain region 113 corresponds to a section of a resonator of the DBR laser 110 and the SOA 120 is only thermally coupled to outside the resonator of the DBR laser 110.

For example, referring to FIG. 3, in a start channel, a first supply current ($I_{RG}$=0 mA) is hardly provided to the RG region 112, and a second supply current $I'_{Gain}$ and a third supply current $I'_{SOA}$ that are provided to the optical gain region 113 and the SOA 120, respectively, may have constant magnitudes.

In this example, to convert a wavelength of an output optical signal, that is, to switch the wavelength to a destination channel, the optical signal transmission apparatus 100 may increase the first supply current $I_{RG}$ of tens of mA provided to the RG region 112. To suppress a wavelength drift phenomenon caused by the first supply current $I_{RG}$ provided to the RG region 112, the optical signal transmission apparatus 100 may supply, using the processor 130, a first compensation current corresponding to $\Delta I_{Gain}$ to the optical gain region 113 and supply a second compensation current corresponding to $\Delta I_{SOA}$ to the SOA 120 in the start channel.

Figure 4:
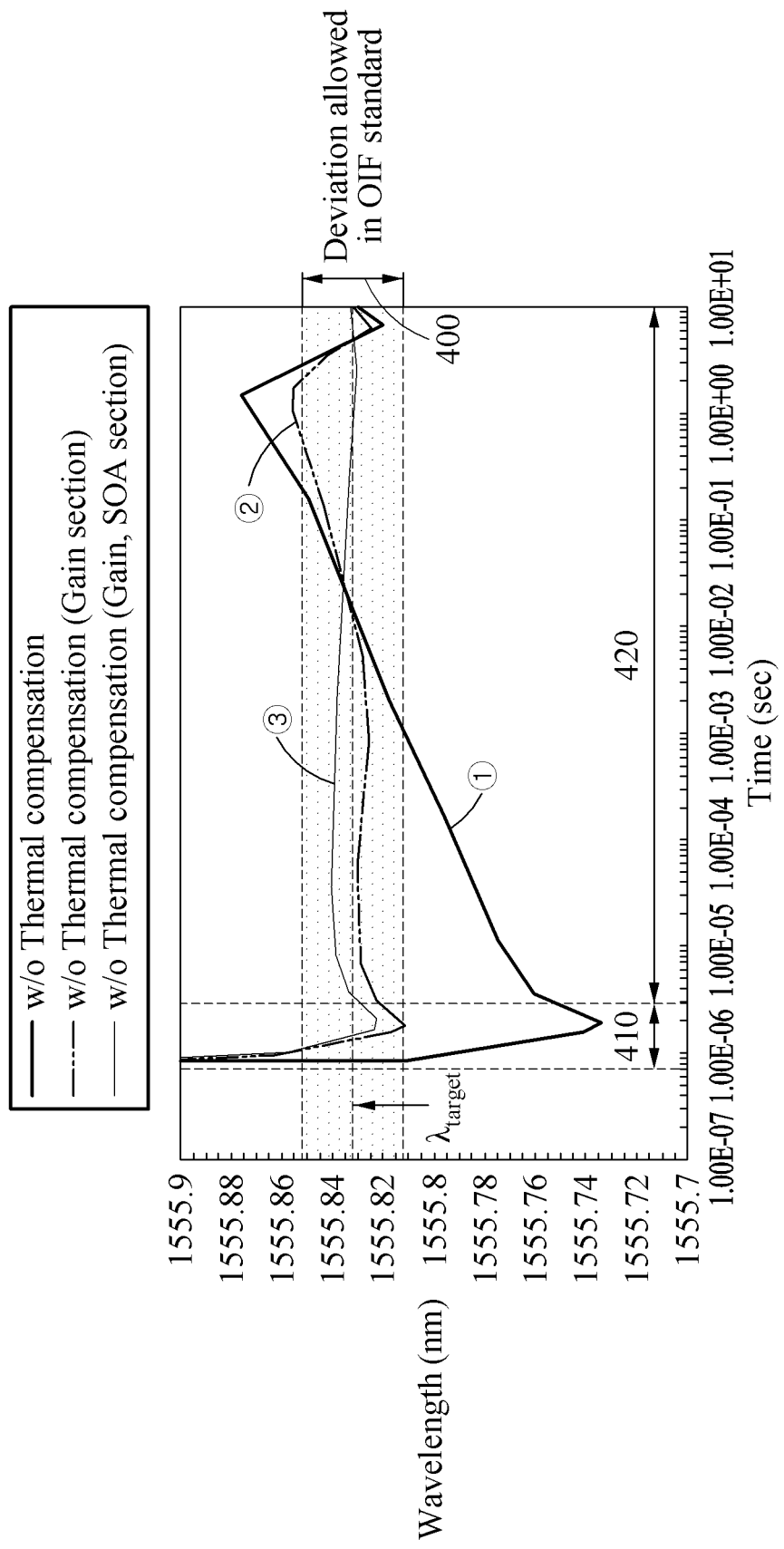
FIG. 4 is a graph illustrating results obtained by suppressing a wavelength drift phenomenon according to an example embodiment.

FIG. 4 is a graph illustrating results obtained by suppressing a wavelength drift phenomenon according to an example embodiment.

FIG. 4 illustrates experimental results showing that a wavelength drift phenomenon of the entire optical signal transmission apparatus 100 is suppressed when compensation currents are supplied to the optical gain region 113 of the DBR laser 110 and the SOA 120. For example, a second supply current $I'_{Gain}$ with a constant magnitude and a third supply current $I'_{SOA}$ may continue to be provided to the optical gain region 113 and the SOA 120 in a start channel.

In the graph of FIG. 4, a line ① shows a change in a wavelength over time when a first supply current of 0 mA to 60 mA is provided to the RG region 112 of the DBR laser 110 and when a compensation current is not supplied. In other words, supply currents provided to the optical gain region 113 and the SOA 120 in a start channel and a destination channel may remain unchanged ($I'_{Gain}=I_{Gain}$, $I'_{SOA}=I_{SOA}$). It may be confirmed from the graph that wavelengths are far out of a wavelength allowable range 400 allowed in an optical internetworking forum (OIF) standard in both a time interval 410 in which a carrier effect occurs and a time interval 420 in which a thermal effect occurs.

To suppress a wavelength overshoot due to the above carrier effect, the optical signal transmission apparatus 100 may supply a first compensation current corresponding to $\Delta I_{Gain}$ to the optical gain region 113 in the start channel. The supplied first compensation current may have an opposite sign to that of the first supply current and may be adjusted in proportion to a magnitude of the first supply current.

A line ② of the graph shows a change in a wavelength over time when the first compensation current is supplied to the optical gain region 113 as described above. It may be confirmed from the graph that an output wavelength in the time interval 410 satisfies the wavelength allowable range 400 allowed in the OIF standard due to a reduction in the carrier effect by the first compensation current supplied to the optical gain region 113 in the start channel. Also, it may be confirmed in the time interval 420 that since a temperature of the DBR laser 110 is slightly changed by supplying the first compensation current, the wavelength drift phenomenon due to the thermal effect is properly suppressed as well as the carrier effect.

However, a wavelength drift phenomenon due to a thermal effect may still occur because the temperature of the DBR laser 110 is not completely compensated for although the first compensation current is supplied to the optical gain region 113.

To suppress the wavelength drift phenomenon due to the thermal effect, the optical signal transmission apparatus 100 may supply a second compensation current corresponding to $\Delta I_{SOA}$ to the SOA 120 in the start channel. The supplied second compensation current may have an opposite sign to that of the first supply current and may be adjusted in proportion to the magnitude of the first supply current.

A line ③ of the graph shows a change in a wavelength over time when compensation currents are supplied to both the optical gain region 113 and the SOA 120. It may be confirmed from the graph that an output wavelength in the time interval 410 satisfies the wavelength allowable range 400 allowed in the OIF standard due to a reduction in the carrier effect by the first compensation current supplied to the optical gain region 113 in the start channel. Also, it may be confirmed that an output wavelength in the time interval 420 satisfies the wavelength allowable range 400 allowed in the OIF standard due to a reduction in the thermal effect by the second compensation current supplied to the SOA 120 in the start channel.

Figure 5:
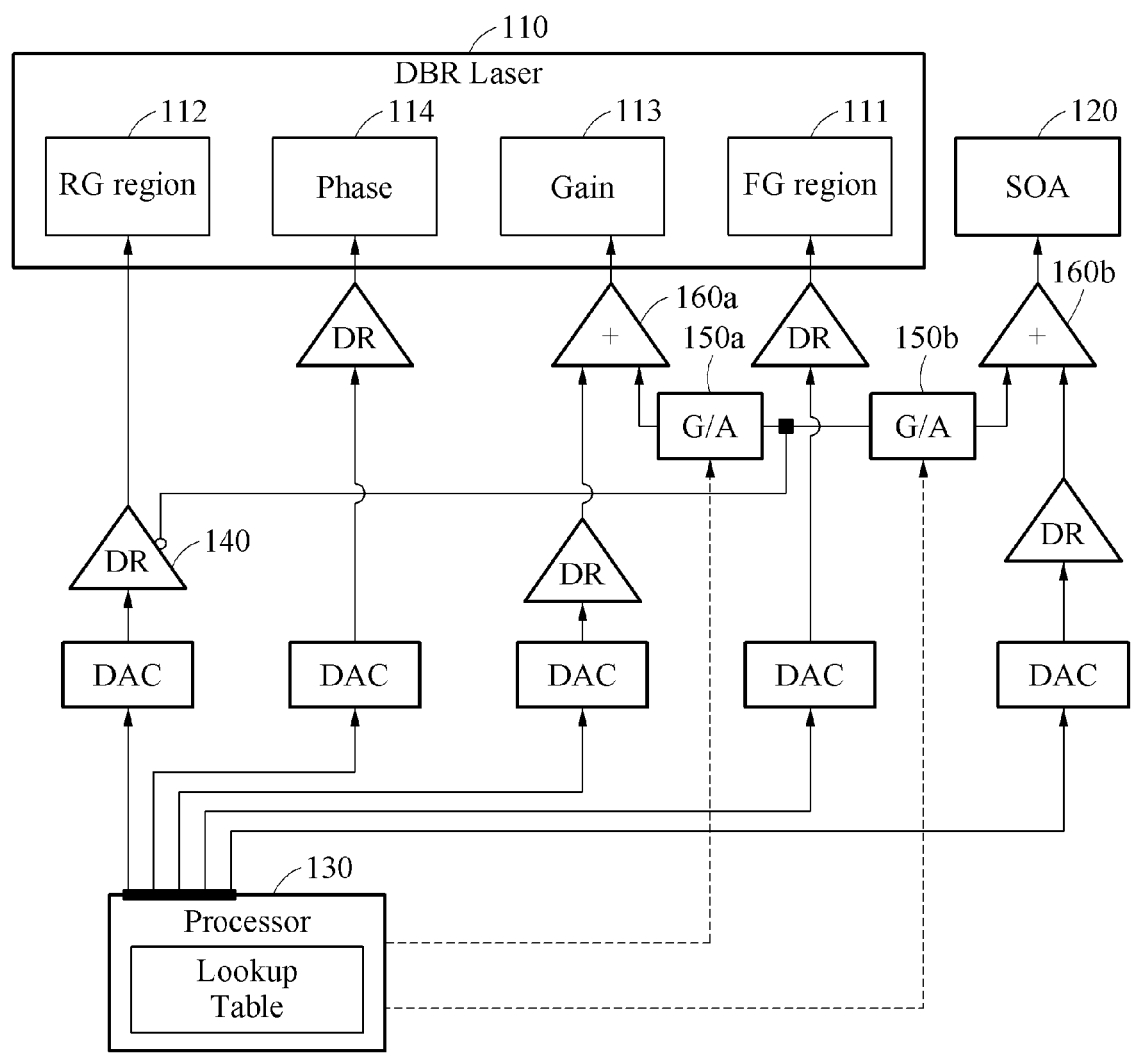
FIG. 5 is a diagram illustrating a hardware example to suppress a wavelength drift phenomenon due to a change in a temperature of a DBR laser according to an example embodiment.

FIG. 5 is a diagram illustrating a hardware example to suppress a wavelength drift phenomenon due to a change in a temperature of a DBR laser according to an example embodiment.

Referring to FIG. 5, an optical signal transmission apparatus 100 may suppress a wavelength drift phenomenon due to a temperature change caused by a wavelength conversion through a simple change in internal hardware instead of modifying a laser process. For example, the optical signal transmission apparatus 100 may control a current driver DR 140 with a differential output corresponding to an RG region 112 of a DBR laser 110, and may supply a first supply current to the RG region 112. A temperature of the RG region 112 may be increased due to the supplied first supply current, which may lead to a wavelength overshoot due to a carrier effect and a wavelength drift phenomenon due to a thermal effect. Thus, a driving circuit of an existing laser module may be simply upgraded by changing the driving circuit.

First Example Embodiment

The optical signal transmission apparatus 100 may suppress a wavelength overshoot due to a carrier effect generated by providing a first supply current to the RG region 112 of the DBR laser 110 based on a wavelength conversion request. In other words, the first example embodiment may be suitable for an application that outputs an optical signal with a wavelength stabilized by a completion of wavelength switching in the time interval 410.

For example, the optical signal transmission apparatus 100 may control the current driver 140 corresponding to the RG region 112 in a start channel and may supply a first compensation current with an opposite sign to that of the first supply current to an optical gain region 113 of the DBR laser 110. In this example, the optical signal transmission apparatus 100 may adjust a magnitude of the first compensation current using a separate current adjuster 150a. The current adjuster 150a may adjust a magnitude of a compensation current in proportion to a magnitude of the first supply current. The current adjuster 150a may be, for example, a device (G/A) configured to amplify or attenuate a gain of an electrical signal. In other words, based on a control signal provided by the processor 130, the current adjuster 150a may be enabled, and the current adjuster 150*b* may be disabled. The first compensation current having the adjusted magnitude may be combined with a second supply current that continues to be provided to the optical gain region 113 by an electric adder 160*a* so as to be supplied to the optical gain region 113.

The optical signal transmission apparatus 100 may reduce a magnitude of the second supply current provided to the optical gain region 113 by the magnitude of the first compensation current while performing wavelength switching by providing the first supply current to the RG region 112. Through the above operation, the optical signal transmission apparatus 100 may suppress a wavelength overshoot of an output wavelength in the time interval 410 by reducing the carrier effect.

Second Example Embodiment

The optical signal transmission apparatus 100 may suppress a wavelength drift phenomenon due to a thermal effect generated by providing a first supply current to the RG region 112 of the DBR laser 110 based on a wavelength conversion request. In other words, the second example embodiment may be suitable for an application that maintains a wavelength of an optical signal that is completely switched in the time interval 420.

For example, the optical signal transmission apparatus 100 may control the current driver 140 corresponding to the RG region 112 and may supply a second compensation current with an opposite sign to that of the first supply current to an SOA 120. In this example, the optical signal transmission apparatus 100 may adjust a magnitude of the second compensation current using a separate current adjuster 150*b*. The current adjuster 150*b* may adjust the magnitude of the second compensation current in proportion to the magnitude of the first supply current. The current adjuster 150*b* may be, for example, a device configured to amplify or attenuate a gain of an electrical signal. In other words, based on a control signal provided by the processor 130, the current adjuster 150*a* may be disabled, and the current adjuster 150*b* may be enabled. The second compensation current having the adjusted magnitude may be combined with a third supply current that continues to be provided to the SOA 120 by an electric adder 160*b* so as to be supplied to the SOA 120.

The optical signal transmission apparatus 100 may reduce a magnitude of the third supply current provided to the SOA 120 by the magnitude of the second compensation current while performing wavelength switching by providing the first supply current to the RG region 112. Through the above operation, the optical signal transmission apparatus 100 may suppress a wavelength drift phenomenon of an output wavelength in the time interval 420 by reducing the thermal effect.

Third Example Embodiment

The optical signal transmission apparatus 100 may suppress a wavelength overshoot due to a carrier effect and a wavelength drift phenomenon due to a thermal effect. The carrier effect and the thermal effect may occur when a first supply current is provided to the RG region 112 of the DBR laser 110 based on a wavelength conversion request. In other words, the third example embodiment may be suitable for an application that outputs an optical signal with a wavelength stabilized by a completion of wavelength switching in the time interval 410 and that maintains a wavelength of an optical signal that is completely switched in the time interval 420.

For example, the optical signal transmission apparatus 100 may control the current driver 140 corresponding to the RG region 112, may supply a first compensation current with an opposite sign to that of the first supply current to the optical gain region 113 of the DBR laser 110, and may supply a second compensation current with an opposite sign to that of the first supply current to the SOA 120. In this example, the optical signal transmission apparatus 100 may adjust a magnitude of each of the first compensation current and the second compensation current using the current adjusters 150*a* and 150*b*. The current adjusters 150*a* and 150*b* may adjust a magnitude of each of the first compensation current and the second compensation current in proportion to the magnitude of the first supply current. The current adjusters 150*a* and 150*b* may be, for example, devices configured to amplify or attenuate a gain of an electrical signal. In other words, based on a control signal provided by the processor 130, both the current adjusters 150*a* and 150*b* may be enabled. The first compensation current and the second compensation current having the adjusted magnitudes may be combined with the second supply current that continues to be provided to the optical gain region 113 and the third supply current that continues to be provided to the SOA 120 by the electric adders 160*a* and 160*b* so as to be supplied to the optical gain region 113 and the SOA 120.

The optical signal transmission apparatus 100 may reduce a magnitude of the second supply current provided to the optical gain region 113 by the magnitude of the first compensation current and may reduce a magnitude of the third supply current provided to the SOA 120 by the magnitude of the second compensation current while performing wavelength switching by providing the first supply current to the RG region 112. Through the above operation, the optical signal transmission apparatus 100 may suppress a wavelength overshoot of an output wavelength in the time interval 410 by reducing the carrier effect, and may suppress a wavelength drift phenomenon of an output wavelength in the time interval 420 by reducing the thermal effect.

In the above hardware implementation method, a compensation current may be supplied using a current driver with a differential output corresponding to the RG region 112 of the DBR laser 110, and thus it is possible to easily perform a time synchronization. Also, although a supply current ideally has a waveform of a step function, each driver may actually have different waveforms. However, since a single differential driver is used to supply a supply current to the RG region 112 and to supply compensation currents to the optical gain region 113 and the SOA 120, it is possible to perform an operation by signals with similar waveforms. Since compensation currents are supplied to the optical gain region 113 and the SOA 120 in proportion to a magnitude of a supply current supplied to the RG region 112 instead of modifying a lookup table, it is possible to automatically adjust a magnitude of each of the compensation currents.

As described above, the present disclosure relates to a DS-DBR laser among DBR lasers. Also, since a current of the RG region 112 is typically considerably greater than currents of the FG region 111 and the phase region 114, a wavelength drift phenomenon may dominantly occur due to the current of the RG region 112. Thus, in the present disclosure, the wavelength drift phenomenon due to the current of the RG region 112 may be taken into consideration.

Figure 6:
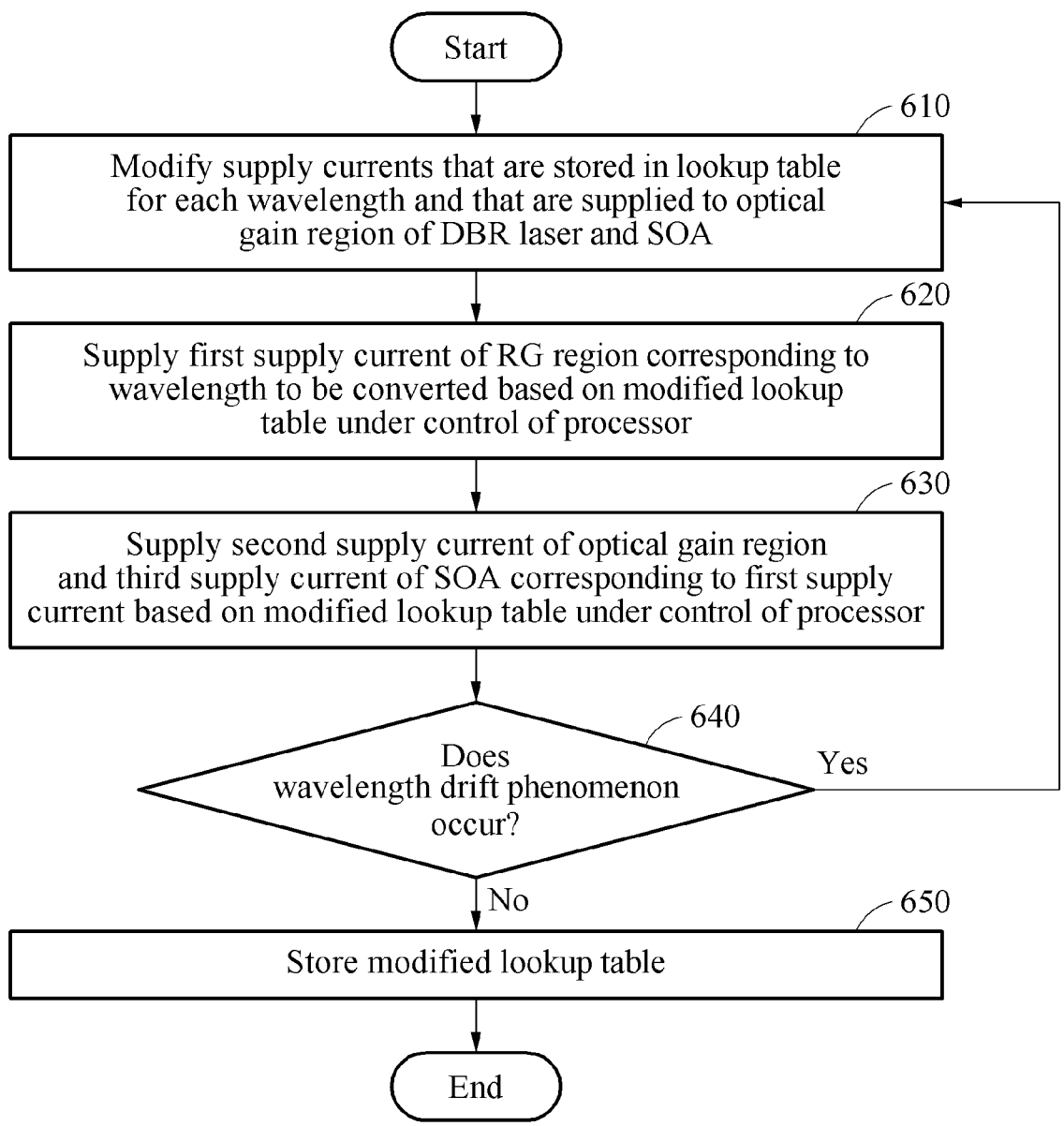
FIG. 6 is a flowchart illustrating a software example of a method to suppress a wavelength drift phenomenon due to a change in a temperature of a DBR laser according to an example embodiment.

FIG. 6 is a flowchart illustrating a software example of a method to suppress a wavelength drift phenomenon due to a change in a temperature of a DBR laser according to an example embodiment.

Referring to FIG. 6, an optical signal transmission apparatus 100 according to an example embodiment may suppress the wavelength drift phenomenon using the method. To this end, the optical signal transmission apparatus 100 may modify a lookup table of a processor 130 to operate a DBR laser 110. Generally, the processor 130 of the optical signal transmission apparatus 100 may store, in the lookup table, different first supply currents of an RG region 112 of the DBR laser 110 for each wavelength of an optical signal to be output, and a second supply current of an optical gain region 113 of the DBR laser 110 and a third supply current of an SOA 120. The second supply current and the third supply current may have constant values regardless of a wavelength.

In operation 610, the optical signal transmission apparatus 100 may modify supply currents that are stored in the lookup table for each wavelength to be output and that are supplied to the optical gain region 113 and the SOA 120. For example, the supply currents supplied to the optical gain region 113 of the DBR laser 110 and the SOA 120 may be modified respectively based on a first compensation current and a second compensation current that are determined based on the first supply current supplied to the RG region 112.

The above compensation currents may be heuristically acquired through an experiment. Typically, compensation currents supplied to the optical gain region 113 and the SOA 120 may be less than the first supply current supplied to the RG region 112. For example, when a maximum switching current value is applied to the RG region 112 and when maximum compensation currents for the optical gain region 113 and the SOA 120 corresponding to the maximum switching current value are found, compensation currents for the optical gain region 113 and the SOA 120 may be adjusted in proportion to a switching current value for the RG region 112. In this example, when a compensation current value is searched for in a large current unit, the compensation current value may be quickly found, however, a wavelength stability (accuracy) may decrease. When a compensation current value is searched for in a small current unit, the compensation current value may be slowly found, however, a wavelength stability (accuracy) may increase.

The optical signal transmission apparatus 100 may modify the lookup table by adding the determined compensation current value to the second supply current and the third supply current that continue to be supplied to the optical gain region 113 and the SOA 120 in the start channel.

In operation 620, the optical signal transmission apparatus 100 may supply a first supply current of the RG region 112 corresponding to a wavelength to be converted based on the modified lookup table, under a control of a processor 130.

In operation 630, the optical signal transmission apparatus 100 may supply a second supply current of the optical gain region 113 and a third supply current of the SOA 120 corresponding to the first supply current, based on the modified lookup table to suppress a wavelength drift phenomenon that may occur due to the first supply current, under the control of the processor 130.

In operation 640, the optical signal transmission apparatus 100 may determine whether the wavelength drift phenomenon occurs by verifying a wavelength of an output optical signal.

In an example, when the wavelength drift phenomenon does not occur, the optical signal transmission apparatus 100 may store the modified lookup table in operation 650. In another example, when the wavelength drift phenomenon occurs, operations 610 through 630 may be repeated to find an optimum compensation current.

According to example embodiments, it is possible to maintain a constant temperature of an entire optical signal transmission apparatus by supplying compensation currents to an optical gain region and an SOA in response to a temperature being increased by a current supplied to a DBR mirror region in a DBR wavelength tunable laser.

The components described in the example embodiments may be implemented by hardware components including, for example, at least one digital signal processor (DSP), a processor, a controller, an application-specific integrated circuit (ASIC), a programmable logic element, such as an FPGA, other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be embodied as a program that is executable by a computer, and may be implemented as various recording media such as a magnetic storage medium, an optical reading medium, and a digital storage medium.

Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing by, or to control an operation of a data processing apparatus, e.g., a programmable processor, a computer, or multiple computers. A computer program(s) may be written in any form of a programming language, including compiled or interpreted languages and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network.

Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic, magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc. and magneto-optical media such as a floptical disk, and a read only memory (ROM), a random access memory (RAM), a flash memory, an erasable programmable ROM (EPROM), and an electrically erasable programmable ROM (EEPROM). A processor and a memory may be supplemented by, or integrated into, a special purpose logic circuit.

Also, non-transitory computer-readable media may be any available media that may be accessed by a computer, and may include both computer storage media and transmission media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

What is claimed is:

1. An optical signal transmission apparatus comprising:
   a distributed Bragg reflector (DBR) laser comprising a DBR mirror region configured to convert an output wavelength of an optical signal to another output wavelength based on a first supply current upon a request for the conversion of the output wavelength of the optical signal, and an optical gain region configured to control a gain of the optical signal based on a second supply current;
   a semiconductor optical amplifier (SOA) configured to amplify the optical signal outputted from the DBR laser based on a third supply current; and
   a processor configured to supply a compensation current to the optical gain region during a time interval where a requested wavelength is changed and maintained to suppress a wavelength overshoot due to a carrier effect caused by the first supply current provided to the DBR mirror region upon the wavelength conversion request.

2. The optical signal transmission apparatus of claim 1, wherein the processor is configured to supply a compensation current with an opposite sign to that of the first supply current to the optical gain region based on a wavelength switching time required by an application to which the DBR laser is applied.

3. The optical signal transmission apparatus of claim 1, wherein the processor is configured to adjust a magnitude of the compensation current to be in proportion to a magnitude of the first supply current.

4. An optical signal transmission apparatus comprising:
   a distributed Bragg reflector (DBR) laser comprising a DBR mirror region configured to convert an output wavelength of an optical signal to another output wavelength based on a first supply current upon a request for the conversion of the output wavelength of the optical signal, and an optical gain region configured to control a gain of the optical signal based on a second supply current;
   a semiconductor optical amplifier (SOA) configured to amplify the optical signal outputted from the DBR laser based on a third supply current; and
   a processor configured to supply a compensation current to the SOA during a time interval where a requested wavelength is changed and maintained, to suppress a wavelength drift phenomenon due to a thermal effect caused by the first supply current provided to the DBR mirror region upon the wavelength conversion request.

5. The optical signal transmission apparatus of claim 4, wherein the processor is configured to supply a compensation current with an opposite sign to that of the first supply current to the SOA based on a wavelength maintenance time required by an application to which the DBR laser is applied.

6. The optical signal transmission apparatus of claim 4, wherein the processor is configured to adjust a magnitude of the compensation current to be in proportion to a magnitude of the first supply current.

7. An optical signal transmission apparatus comprising:
   a distributed Bragg reflector (DBR) laser comprising a DBR mirror region configured to convert an output wavelength of an optical signal to another output wavelength based on a first supply current upon a request for the conversion of the output wavelength of the optical signal, and an optical gain region configured to control a gain of the optical signal based on a second supply current;
   a semiconductor optical amplifier (SOA) configured to amplify the optical signal outputted from the DBR laser based on a third supply current; and
   a processor configured to supply a first compensation current and a second compensation current to the optical gain region and the SOA during a time interval where a requested wavelength is changed and maintained, respectively, to suppress a wavelength overshoot due to a carrier effect caused by the first supply current provided to the DBR mirror region and a wavelength drift phenomenon due to a thermal effect caused by the first supply current, upon the wavelength conversion request.

8. The optical signal transmission apparatus of claim 7, wherein the processor is configured to:
   supply a first compensation current with an opposite sign to that of the first supply current to the optical gain region based on a wavelength switching time required by an application to which the DBR laser is applied; and supply a second compensation current with an opposite sign to that of the first supply current to the SOA based on a wavelength maintenance time required by the application to which the DBR laser is applied.

9. The optical signal transmission apparatus of claim 7, wherein the processor is configured to adjust a magnitude of each of the first compensation current and the second compensation current to be in proportion to a magnitude of the first supply current.

* * * * *